United States Patent
Kawashima et al.

(10) Patent No.: US 9,927,701 B2
(45) Date of Patent: Mar. 27, 2018

(54) DETECTION APPARATUS, IMPRINT APPARATUS, AND METHOD OF MANUFACTURING ARTICLE

(71) Applicant: CANON KABUSHIKI KAISHA, Tokyo (JP)

(72) Inventors: Tooru Kawashima, Shioya-gun (JP); Kenji Yaegashi, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 215 days.

(21) Appl. No.: 14/539,114

(22) Filed: Nov. 12, 2014

(65) Prior Publication Data
US 2015/0146207 A1 May 28, 2015

(30) Foreign Application Priority Data

Nov. 26, 2013 (JP) .................. 2013-244329
Oct. 22, 2014 (JP) .................. 2014-215659

(51) Int. Cl.
*G03F 7/00* (2006.01)
*G03F 9/00* (2006.01)

(52) U.S. Cl.
CPC .......... *G03F 7/0002* (2013.01); *G03F 9/7042* (2013.01)

(58) Field of Classification Search
CPC .... G03F 7/0002; G03F 7/0012; G03F 7/0015; G03F 7/70691; G03F 9/00; G03F 9/7003; G03F 9/7023; G03F 9/7026; G03F 9/703; G03F 9/7034; G03F 9/7038; G03F 9/7042; G03F 9/7046; G03F 9/7065; G03F 9/7069; G03F 9/7088
See application file for complete search history.

(56) References Cited

U.S. PATENT DOCUMENTS

| | | | | |
|---|---|---|---|---|
| 6,271,910 B1* | 8/2001 | Uzawa | ................ | G03F 7/706 355/53 |
| 6,483,571 B1* | 11/2002 | Shiraishi | ........... | G03F 9/7015 355/53 |
| 8,703,035 B2 | 4/2014 | Sato | | |
| 2004/0119960 A1* | 6/2004 | Osakabe | ........... | G03F 9/7011 355/53 |

(Continued)

FOREIGN PATENT DOCUMENTS

| | | | | |
|---|---|---|---|---|
| JP | 2008-522412 A | * | 6/2008 | ......... B82Y 10/00 |
| JP | 4185941 B2 | | 11/2008 | |

(Continued)

*Primary Examiner* — Gordon J Stock, Jr.
(74) *Attorney, Agent, or Firm* — Rossi, Kimms & McDowell LLP

(57) ABSTRACT

The present invention provides a detection apparatus for detecting a plurality of marks, comprising a plurality of detection units each including a mirror and a scope configured to detect light from the marks via the mirror, wherein the plurality of detection units include a first detection unit, a second detection unit, and a third detection unit, and in a surface direction parallel to a surface on which the plurality of marks are arranged, a direction of an optical axis between the mirror and the scope in the third detection unit is different from at least one of a direction of an optical axis between the mirror and the scope in the first detection unit and a direction of an optical axis between the mirror and the scope in the second detection unit.

18 Claims, 8 Drawing Sheets

(56) References Cited

U.S. PATENT DOCUMENTS

| | | | |
|---|---|---|---|
| 2004/0257550 A1* | 12/2004 | Kasumi | G03F 7/7035 355/53 |
| 2006/0114450 A1* | 6/2006 | Nimmakayala | B82Y 10/00 356/139.04 |
| 2010/0118290 A1* | 5/2010 | Sato | G03F 7/70716 355/74 |
| 2011/0075123 A1* | 3/2011 | Nagamori | G03F 9/7073 355/72 |
| 2013/0100459 A1 | 4/2013 | Iwai et al. | |
| 2013/0234371 A1* | 9/2013 | Yamaguchi | G03F 7/0002 264/446 |

FOREIGN PATENT DOCUMENTS

| | | |
|---|---|---|
| JP | 2011-243664 A | 12/2011 |
| JP | 2013-102139 A | 5/2013 |

\* cited by examiner

F I G. 1
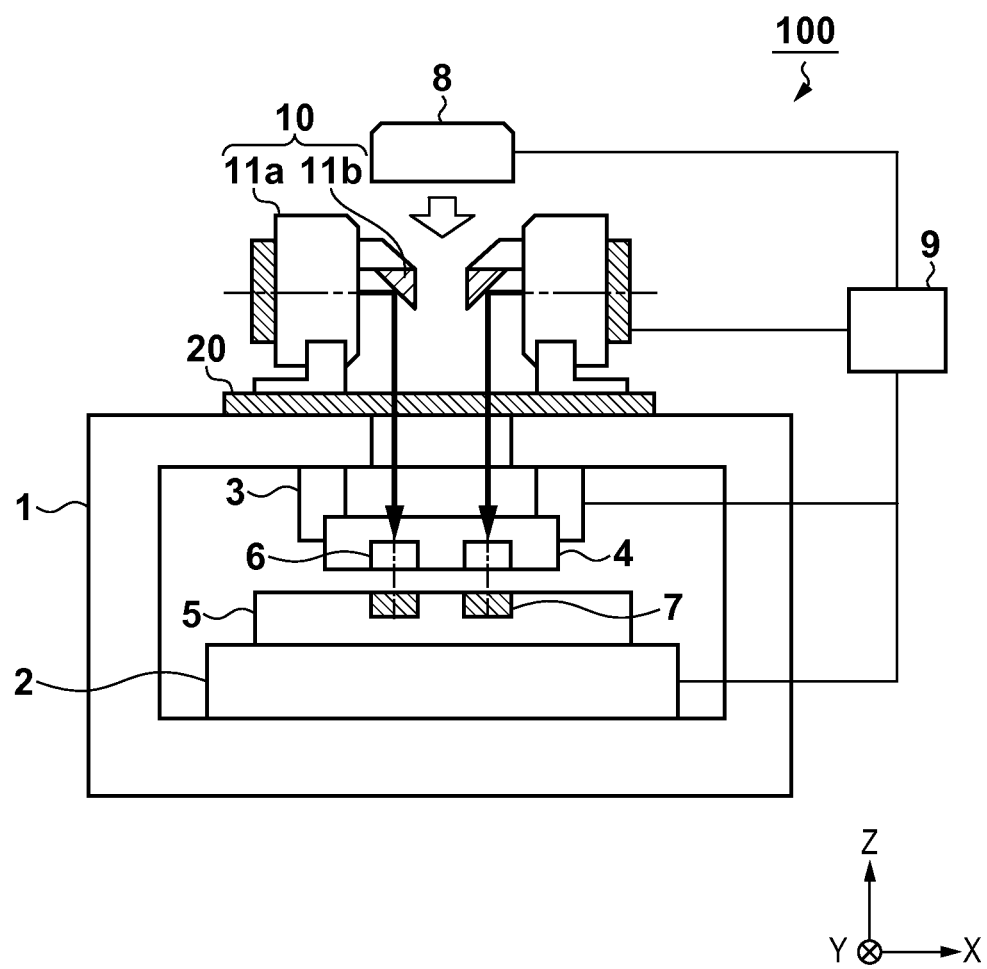

F I G. 5A
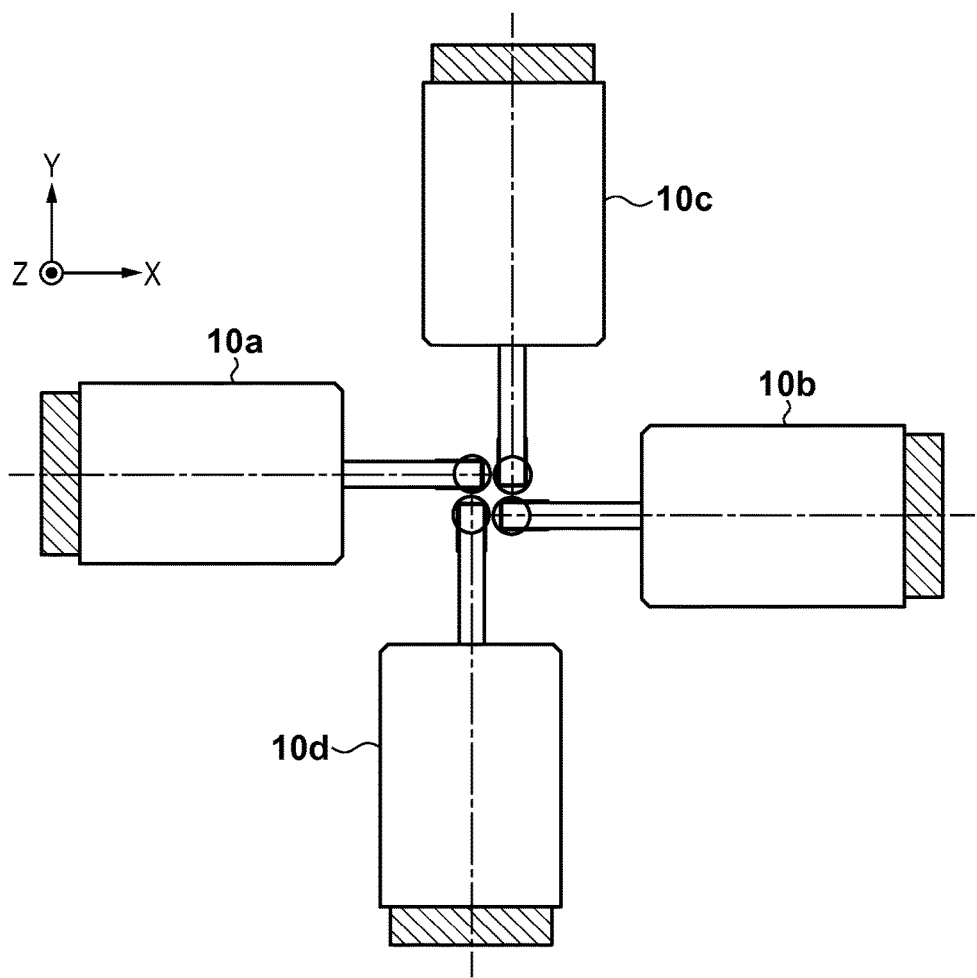
F I G. 5B
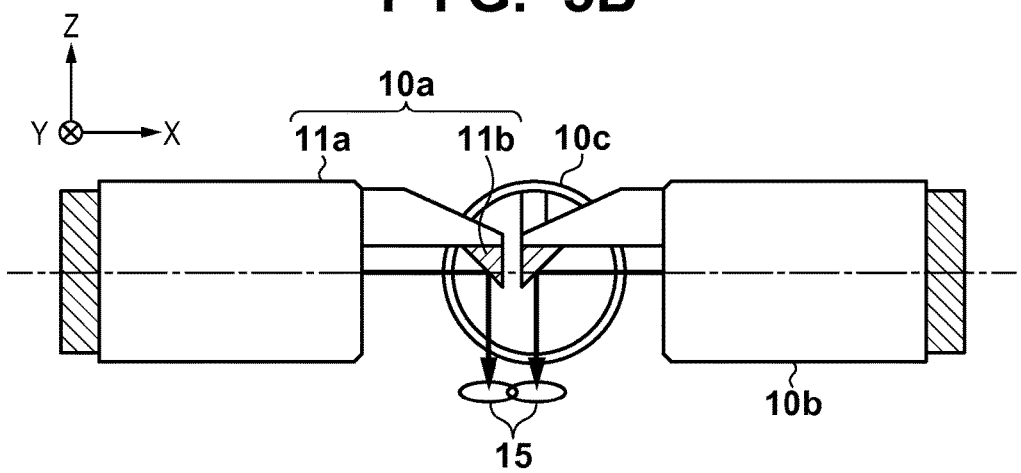

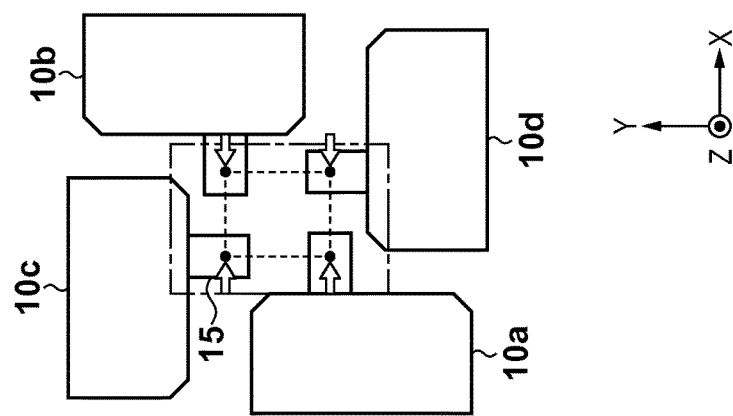
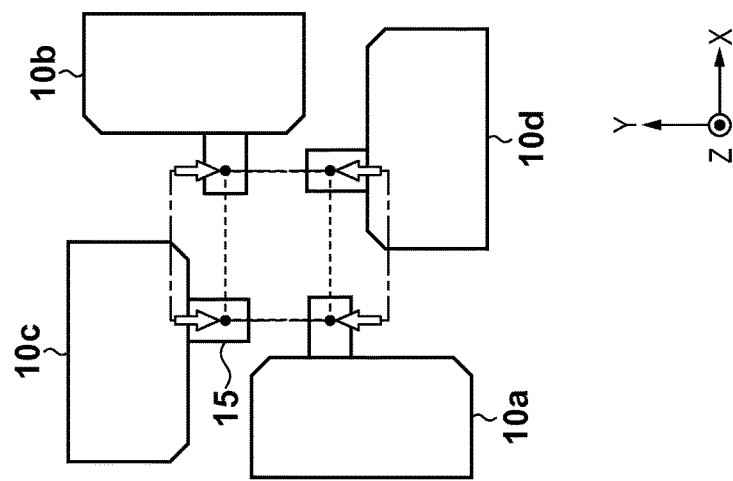
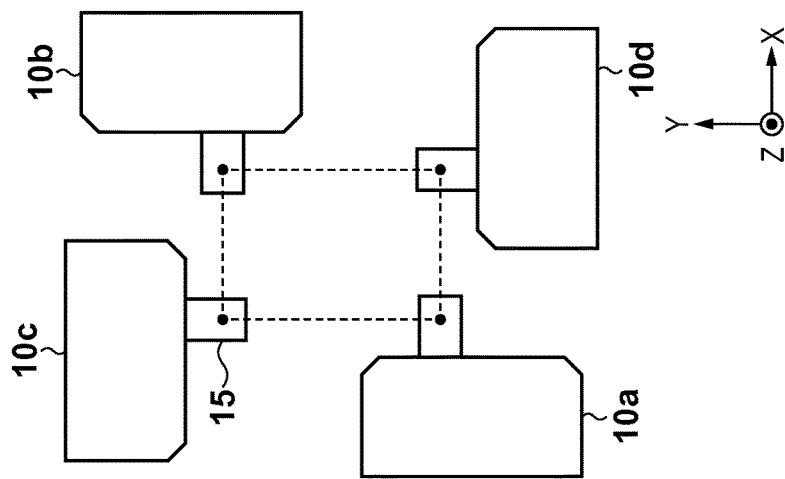

DETECTION APPARATUS, IMPRINT APPARATUS, AND METHOD OF MANUFACTURING ARTICLE

BACKGROUND OF THE INVENTION

Field of the Invention

The present invention relates to a detection apparatus for detecting a plurality of marks, an imprint apparatus for including the detection apparatus, and a method of manufacturing an article.

Description of the Related Art

An imprint apparatus is one of the apparatuses used in the manufacturing step (lithography step) of semiconductor devices and the like. The imprint apparatus brings a pattern region on a mold and an imprint material on a substrate into contact with each other, and cures the imprint material in that state. Then, the imprint apparatus can transfer the pattern on the mold onto the substrate by separating the mold from the cured imprint material.

The imprint apparatus is required to accurately transfer the pattern on the mold to a shot region formed on the substrate. Japanese Patent No. 4185941 has proposed an imprint apparatus which employs a die-by-die alignment method as an alignment method used when transferring the pattern on the mold onto the shot region. The die-by-die alignment method is an alignment method of performing alignment between the substrate and the mold by detecting a mark formed in the shot region and a mark formed on the mold, for each shot region on the substrate.

In the imprint apparatus, when the alignment between the substrate and the mold is performed, a plurality of detection units may detect a plurality of marks provided in the shot region to increase a throughput. Furthermore, in recent years, even when, for example, only one chip area is included in a shot region arranged in the peripheral portion of the substrate, the pattern on the mold may be transferred accurately to that chip area to raise a yield. That is, the imprint apparatus is required to cause the plurality of detection units to detect the plurality of marks provided in a region smaller than the shot region.

SUMMARY OF THE INVENTION

The present invention provides, for example, a technique advantageous in detecting a plurality of marks.

According to one aspect of the present invention, there is provided a detection apparatus for detecting a plurality of marks, the apparatus comprising: a plurality of detection units each including a mirror and a scope configured to detect light from the marks via the mirror, wherein the plurality of detection units include a first detection unit, a second detection unit, and a third detection unit configured to detect light from the marks which are different from each other, and in a surface direction parallel to a surface on which the plurality of marks are arranged, a direction of an optical axis between the mirror and the scope in the third detection unit is different from at least one of a direction of an optical axis between the mirror and the scope in the first detection unit and a direction of an optical axis between the mirror and the scope in the second detection unit.

Further features of the present invention will become apparent from the following description of exemplary embodiments with reference to the attached drawings.

BRIEF DESCRIPTION OF THE DRAWINGS

FIG. 1 is a schematic view showing an imprint apparatus according to the first embodiment;

FIG. 5A is a view showing the arrangement of the plurality of detection units in the imprint apparatus according to the first embodiment when viewed from the Z direction;

FIG. 5B is a view showing the arrangement of the plurality of detection units in the imprint apparatus according to the first embodiment when viewed from the Y direction;

FIG. 7A is a view showing the arrangement of the plurality of detection units in the imprint apparatus according to the first embodiment;

FIG. 7B is a view showing the arrangement of the plurality of detection units in the imprint apparatus according to the first embodiment;

FIG. 7C is a view showing the arrangement of the plurality of detection units in the imprint apparatus according to the first embodiment.

DESCRIPTION OF THE EMBODIMENTS

Figure 2:
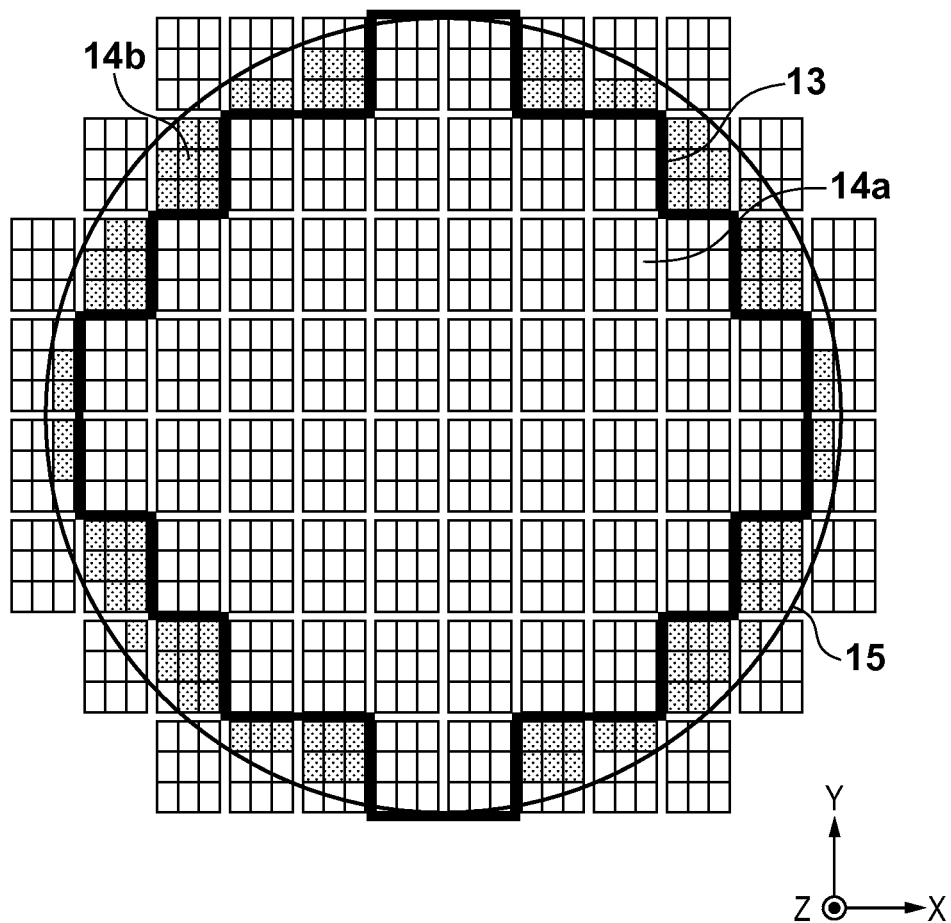
FIG. 2 is a view showing the arrangement of a plurality of shot regions on a substrate.

Exemplary embodiments of the present invention will be described below with reference to the accompanying drawings. Note that the same reference numerals denote the same members throughout the drawings, and a repetitive description thereof will not be given. In the embodiments below, a description will be made assuming that the first and the second directions which are perpendicular to each other in a surface direction parallel to a substrate surface (a surface on which the plurality of marks are arranged) will be defined as X and Y directions, respectively, and a direction perpendicular to the substrate surface will be defined as a Z direction.

First Embodiment

An imprint apparatus 100 according to the first embodiment of the present invention will be described with reference to FIG. 1. The imprint apparatus 100 is used for manufacturing semiconductor devices and the like, and molds an imprint material on a substrate using a mold 4 on which patterns have been formed. The imprint apparatus 100 cures the imprint material in a state in which, for example, the mold 4 having pattern regions where the patterns have been formed is brought into contact with the imprint material (resin) on the substrate. The imprint apparatus 100 performs an imprint process of transferring the patterns onto the substrate by a process of widening a spacing between the mold 4 and a substrate 5 and separating the mold 4 from the cured imprint material.

An imprint technique includes a heat cycle method using heat and a photo-curing method using light. In the heat cycle method, a thermoplastic resin is supplied (coated) as an imprint material onto a substrate. Then, the thermoplastic resin is heated to a temperature equal to or higher than a glass-transition temperature, thereby increasing the fluidity of the resin. In this state, a mold is pressed against the substrate via the resin, and cooling is performed. After that, a pattern can be formed on the substrate by separating the mold from the resin. On the other hand, in the photo-curing method, for example, an uncured ultraviolet-curing resin is supplied as an imprint material onto a substrate. Then, the ultraviolet-curing resin is irradiated with ultraviolet rays while a mold is pressed against the substrate via the resin. After the resin is cured by the ultraviolet irradiation, a pattern can be formed on the substrate by separating the mold from the resin. The imprint apparatus 100 according to the first embodiment employs the photo-curing method of supplying the ultraviolet-curing resin onto the substrate and irradiating the resin with the ultraviolet rays (light).

FIG. 1 is a schematic view showing the imprint apparatus 100 according to the first embodiment. The imprint apparatus 100 according to the first embodiment can include an imprint head 3 which holds the mold 4, a substrate stage 2 which holds the substrate 5, and a light source 8 which emits light (ultraviolet rays) for curing the imprint material supplied onto the substrate. In this embodiment, a case in which the ultraviolet-curing resin which is cured by ultraviolet irradiation is used as the imprint material. The imprint apparatus 100 can also include a detection apparatus which detects a plurality of marks provided on the substrate 5 and a control unit 9.

The detection apparatus includes marks 6 provided on the mold 4 and a plurality of detection units 10 which detect marks 7 provided in shot regions 14 on the substrate. Each detection unit 10 can include a scope 11a which irradiates the marks 7 provided on the substrate 5 with light and detects the marks 7 by reflected light, and a mirror 11b which reflects light emitted from the scope 11a toward the substrate 5. Each detection unit 10 is formed such that the width of the mirror 11b is narrower than the width of the scope 11a in a direction perpendicular to a direction in which light is emitted from the scope and in a direction parallel to the surface direction (X and Y directions). The control unit 9 includes a CPU and a memory, and controls an imprint process in the imprint apparatus 100 (controls the respective units of the imprint apparatus 100). For example, the control unit 9 obtains the relative positions of the shot regions 14 on the substrate and the pattern regions on the mold 4 using detection results by the respective detection units 10, thereby controlling alignment between the mold 4 and the substrate 5. In the imprint apparatus 100 according to the first embodiment, a structure 1 supports the imprint head 3, the substrate stage 2, and the plurality of detection units 10 respectively, and includes an opening formed for passing through light from each detection unit 10 and light from the light source 8.

The mold 4 is generally made of a material such as quartz capable of transmitting ultraviolet rays. A pattern region including an uneven pattern to be transferred to the resin on the substrate is provided in a part of a substrate-side surface. The marks 6 are provided in the pattern regions to correspond to the marks 7 provided in the shot regions 14 on the substrate in order to transfer the patterns to the shot regions 14 on the substrate accurately. Each detection unit 10 detects the marks 7 provided in the shot regions 14 on the substrate and the marks 6 provided on the mold 4. The control unit 9 obtains the relative positions of the mold 4 and the substrate 5 using the detection results from the respective detection units 10, and performs alignment by moving the substrate stage 2 or the imprint head 3 so that the marks 6 on the mold 4 and the marks 7 on the substrate overlap each other. At this time, a distortion and a magnification error may occur in the shot regions 14 on the substrate. In this case, the control unit 9 may deform the mold 4, using a deforming mechanism (not shown), so that the pattern regions on the mold 4 overlaps the shot regions 14 on the substrate by applying forces to a plurality of portions on the side surface of the mold 4. An actuator such as a piezoelectric element is used as the deforming mechanism. This makes it possible to perform an imprint process by accurately overlaying the pattern regions on the mold 4 on the shot regions 14 on the substrate.

Alignment between the pattern regions on the mold 4 and the shot regions 14 on the substrate will now be described with reference to FIG. 2 and FIGS. 3A, 3B, 3C, and 3D. FIG. 2 is a view showing the arrangement of the plurality of shot regions 14 on the substrate. FIGS. 3A to 3D are views each showing the arrangement of the marks 7 provided in the shot region 14. In the first embodiment, as shown in FIGS. 3A to 3D respectively, each shot region 14 includes nine chip areas 12 (12a, 12b, 12c, 12d, 12e, 12f, 12g, 12h, and 12i), and the marks 7 on each shot region 14 are arranged in the four corners of each chip area 12. Each square in a broken line in FIGS. 3A to 3D shows an observation field (to be referred to as a field 15 hereinafter) in one detection unit 10. Each detection units 10 (scope) generally narrows the fields 15. That is, as the magnification of each detection unit 10 increases, the marks 7 on the substrate can be detected sharply, or accurately. In addition, if the field 15 of each detection unit 10 is narrowed, each detection unit 10 can be made small. On the other hand, if the field 15 is widened, it becomes difficult to satisfy a target optical performance in each detection unit 10. This can increase a cost and make each detection unit 10 large. That is, there is a trade-off relationship between the area of each field 15 and the detection accuracy of each mark 7. Each detection unit 10 may be formed to include one mark 7 in each field 15. In the first embodiment, each detection unit 10 is formed to include one mark 7 in each field 15.

Figure 3:
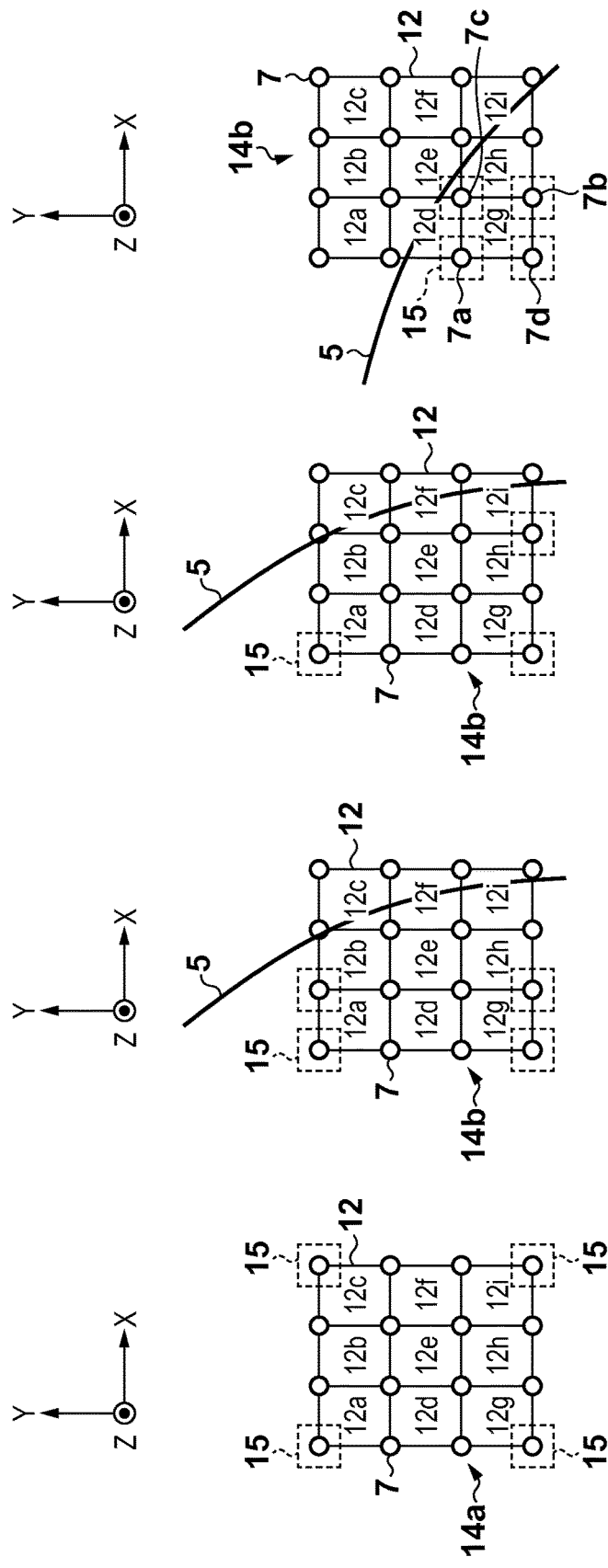
FIG. 3A is a view showing the arrangement of marks provided in the shot region.
FIG. 3B is a view showing the arrangement of the marks provided in the shot region.
FIG. 3C is a view showing the arrangement of the marks provided in the shot region.
FIG. 3D is a view showing the arrangement of the marks provided in the shot region.

As shown in FIG. 2, shot regions 14a arranged in the central portion of the substrate 5 (within a thick line 13 of FIG. 2) include all of nine chip areas 12. In the shot regions 14a thus arranged in the central portion of the substrate 5, for example, as shown in FIG. 3A, the marks 7 arranged in four corners of each chip area 12 and the marks 6 on the mold 4 corresponding to them are detected simultaneously by the plurality of detection units 10. This allows the imprint apparatus 100 (control unit 9) to obtain the relative positions of the substrate 5 and the mold 4 from the detection results by the respective detection units 10, and accurately overlay the pattern regions on the mold 4 on the shot regions 14 on the substrate while performing a shift correction, a magnification correction, or the like.

On the other hand, the shot regions 14 arranged in the peripheral portion of the substrate 5 (to be referred to as deficient shot regions 14b hereinafter) are formed on the substrate in a state in which a part of the pattern regions on the mold is deficient because they include the outer periphery of the substrate 5. Examples of the deficient shot region 14b arranged in the peripheral portion of the substrate 5 are shown in, for example, FIGS. 3B to 3D. In FIGS. 3B to 3D, the chip areas 12 to be chips not including the outer periphery of the substrate 5 and established as products (to be referred to as valid chip areas hereinafter), and the chip areas 12 to be chips including the outer periphery of the substrate 5 and not established as the products are mixed within the deficient shot regions 14*b*. In FIGS. 3B and 3C, five chip areas 12 (12*a*, 12*d*, 12*e*, 12*g*, and 12*h*) will be the valid chip areas established as the products. In FIG. 3D, only the chip area 12*g* will be the valid chip area established as the product.

In recent years, even when only one valid chip area is included in the deficient shot regions 14*b* arranged in the peripheral portion of the substrate 5, it is required to transfer the patterns on the mold 4 to that valid chip area to raise a yield. It is therefore, by detecting the plurality of marks 7 provided in the deficient shot regions 14*b*, alignment between the deficient shot regions 14*b* and the pattern regions on the mold 4 may be performed accurately. When the plurality of detection units 10 simultaneously detect the plurality of marks 7 provided in a region smaller than each shot region 14, however, a spacing between the marks 7 to be detected gets narrow. This may raise a problem of not being able to bring the detection units 10 close to each other.

Figure 4:
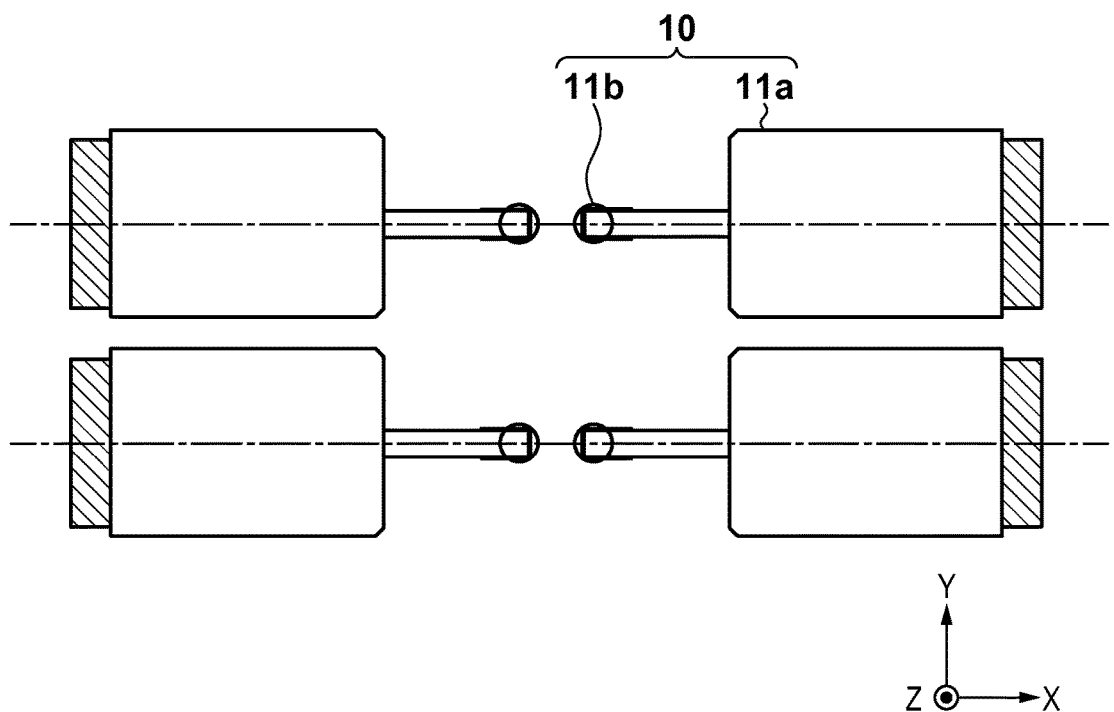
FIG. 4 is a view showing the arrangement of a plurality of detection units in a conventional imprint apparatus when viewed from a Z direction.

Assume a case in which the deficient shot region 14*b* includes five chip areas 12*a*, 12*d*, 12*e*, 12*g*, and 12*h* as the valid chip areas as shown in, for example, FIG. 3B. In this case, the deficient shot region 14*b* and the pattern regions on the mold 4 can be aligned accurately by detecting four marks 7 arranged at the vertexes of each square. That is, the deficient shot region 14*b* and the pattern regions on the mold 4 can be aligned accurately by detecting two marks 7 arranged on the +Y direction side (upper side) of the chip area 12*a* and two marks 7 arranged on the −Y direction side (lower side) of the chip area 12*g*. In a conventional imprint apparatus, as shown in FIG. 4, two detection units 10 are arranged on each of the X direction side and the −X direction side. FIG. 4 is a view showing the arrangement of the plurality of detection units 10 in the conventional imprint apparatus when viewed from a Z direction. In the conventional imprint apparatus, a distance between two detection units 10 on the X direction side and two detection units 10 on the −X direction side can be shortened. As a consequence, in the example shown in FIG. 3B, four detection units 10 can simultaneously detect two marks 7 arranged on the +Y direction side of the chip area 12*a* and two marks 7 arranged on the −Y direction of the chip area 12*g* even in the conventional imprint apparatus.

On the other hand, assume a case in which four detection units 10 detect four marks 7 arranged at the upper left of the chip area 12*a*, the upper right of the chip area 12*e*, the lower left of the chip area 12*g*, and the lower right of the chip area 12*h* as shown in, for example, FIG. 3C. Also assume that two marks 7 arranged at the upper right of the chip area 12*e* and the lower right of the chip area 12*h* are arranged with a spacing narrower than the width of each scope 11*a* in the Y direction. In this case, in the conventional imprint apparatus, if an attempt is made to bring two detection units 10 on the +X direction side close to each other along the Y direction, this attempt is restricted by the width of each scope 11*a* in the Y direction. That is, it can become difficult to bring two detection units 10 on the +X direction side close to each other along the Y direction. In addition, assume a case in which the deficient shot region 14*b* includes only the chip area 12*g* as the valid chip area, as shown in FIG. 3D. In this case, the deficient shot region 14*b* and the pattern regions on the mold 4 can be aligned accurately by detecting four marks 7 provided in the four corners of the chip area 12*g*. In this case, however, since the spacing between the marks 7 is narrower than that in FIG. 3C, it can become more difficult to bring the detection units 10 close to each other. That is, in the conventional imprint apparatus, when the plurality of marks 7 are arranged with the spacing narrower than the width of each scope 11*a*, the plurality of detection units 10 cannot detect the plurality of marks simultaneously. Note that the width of each scope 11*a* refers to the length of each scope 11*a* in a direction perpendicular to a direction in which light is emitted from the scope 11*a* and parallel to the surface of the substrate 5.

To cope with this, in the imprint apparatus 100 according to the first embodiment, the plurality of (four) detection units 10 are arranged as shown in FIGS. 5A and 5B, thereby reducing the interference of the detection units 10. FIG. 5A is a view showing the arrangement of the plurality of detection units 10 in the imprint apparatus 100 according to the first embodiment when viewed from the Z direction, and FIG. 5B is a view showing the arrangement of the plurality of detection units 10 when viewed from the Y direction. Assume a case in which the plurality of detection units 10 include, for example, a first detection unit 10*a*, a second detection unit 10*b*, a third detection unit 10*c*, and a fourth detection unit 10*d*, as shown in FIG. 5A. In this case, the first detection unit 10*a* and the second detection unit 10*b* are arranged so that the direction of an optical axis between the mirror 11*b* and the scope 11*a* in the first detection unit 10*a* and the direction of an optical axis between the mirror 11*b* and the scope 11*a* in the second detection unit 10*b* are parallel to each other. The first detection unit 10*a* and the second detection unit 10*b* are arranged so that directions in which the scopes 11*a* emit light are opposite directions. Also, the third detection unit 10*c* and the fourth detection unit 10*d* are arranged so that the direction of an optical axis between the mirror 11*b* and the scope 11*a* in the third detection unit 10*c* and the direction of an optical axis between the mirror 11*b* and the scope 11*a* in the fourth detection unit 10*d* are parallel to each other. The third detection unit 10*c* and the fourth detection unit 10*d* are arranged so that directions in which the scopes 11*a* emit light opposite directions. Furthermore, the third detection unit 10*c* (fourth detection unit 10*d*) is arranged so that the direction of the optical axis between the mirror 11*b* and the scope 11*a* is perpendicular to the direction of the optical axis between the mirror 11*b* and the scope 11*a* in the first detection unit 10*a* (second detection unit 10*b*). Note that the term "parallel" is not limited to parallel in a strict sense, but includes nearly parallel. Likewise, the term "perpendicular" is not limited to perpendicular in a strict sense, but includes nearly perpendicular, and the term "opposite directions" is not limited to the opposite directions in a strict sense, but includes nearly opposite directions. The detection apparatus can also include a driving unit 20 which individually drives the plurality of detection units 10 at least in the X and Y directions (plane directions parallel to the substrate 5). The control unit 9 controls the driving of each detection unit 10.

Assume a case in which, for example, four marks 7*a*, 7*b*, 7*c*, and 7*d* arranged, as shown in FIG. 3D, in the four corners of one chip area 12*g* are detected. In this case, the mirror 11*b* of each detection unit 10 is arranged within a region whose widths in the X direction and the Y direction are narrower than the width of each scope 11*a*. The first detection unit 10*a* and the second detection unit 10*b* are arranged to detect, out of four marks 7*a* to 7*d*, the marks 7*a* and 7*b* arranged in a diagonal direction. Also, the third detection unit 10*c* and the fourth detection unit 10*d* are arranged to detect, out of four marks 7*a* to 7*d*, the marks 7*c* and 7*d* arranged in a diagonal direction. By arranging the plurality of detection units 10 in this way, it is possible to reduce the interference of the detection units 10 even when detecting the marks 7 arranged on the substrate with a narrow spacing. In the plurality of detection units 10 according to the first embodiment, the mirrors 11b may collide with each other when detecting the marks 7 arranged on the substrate with the narrow spacing. Therefore, a member for relaxing a shock which occurs when the mirrors 11b collide with each other may be provided on the periphery of the mirror 11b in each detection unit 10. As the member, for example, an elastic member such as a spring may be used.

Figure 6:
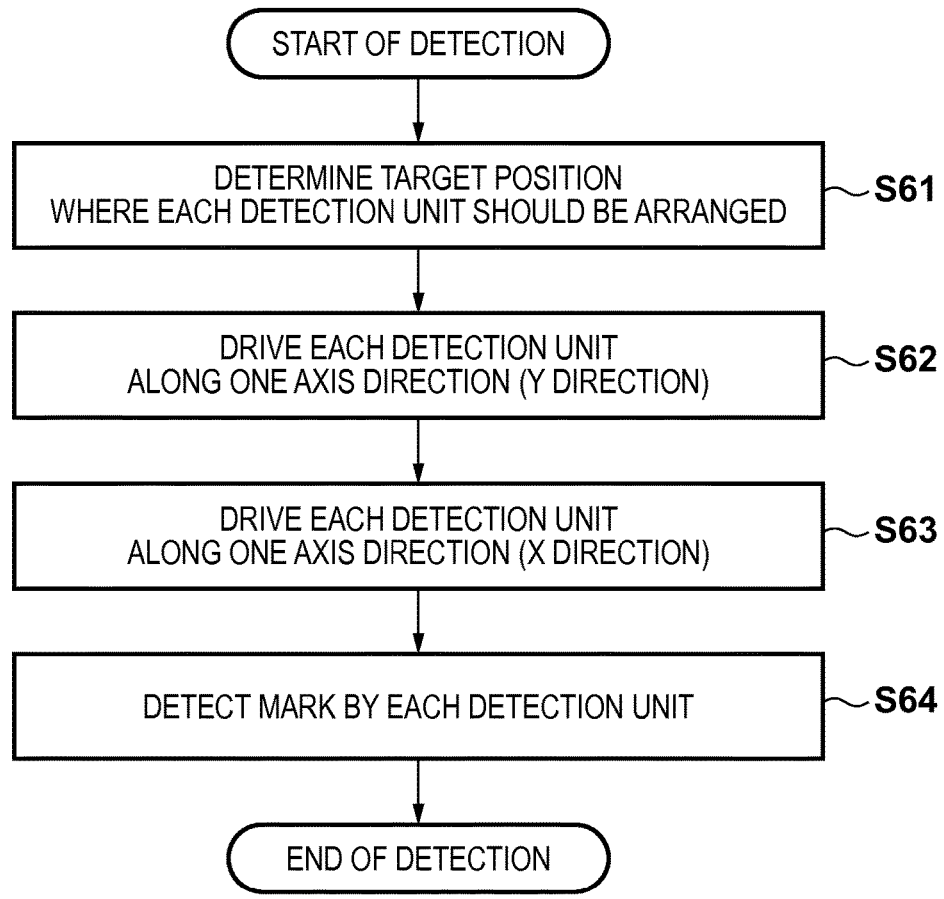
FIG. 6 is a flowchart showing a method of detecting the marks on the substrate by the plurality of detection units.

A method of detecting the marks 7 on the substrate by the plurality of detection units 10 will now be described with reference to FIG. 6 and FIGS. 7A, 7B, and 7C. FIG. 6 is a flowchart showing the method of detecting the marks 7 on the substrate by the plurality of detection units 10. FIGS. 7A to 7C are views showing the arrangement of the plurality of detection units 10 in respective steps shown in the flowchart of FIG. 6 when viewed from the Z direction. The plurality of detection units 10 may detect the marks 7 in a state in which the imprint material on the substrate and the pattern regions on the mold 4 are in contact with each other or in a state in which they are not in contact with each other.

In step S61, the control unit 9 obtains the coordinate information of the marks 7 that should be detected by the plurality of detection units 10, and determines a target position where the respective detection units 10 should be arranged based on the obtained coordinate information of the marks 7. The coordinate information of the marks that should be detected by the plurality of detection units 10 may be measured by a measurement apparatus external to the imprint apparatus 100 beforehand and then obtained, or may be obtained based on design data. In step S62, the control unit 9 drives each detection unit 10 along one axis direction (for example, the Y direction) such that each detection unit 10 is arranged at a position in the Y direction in the target position determined in step S61. At this time, the control unit 9 drives the plurality of detection units 10 in consideration of the shape of each detection unit 10 (the shape of each mirror 11b, in particular) so as to reduce the interference of the detection units 10. When, for example, the plurality of detection units 10 are arranged as shown in FIG. 7A in step S61, the control unit 9 drives the second detection unit 10b and the third detection unit 10c in the −Y direction, and drives the first detection unit 10a and the fourth detection unit 10d in the +Y direction. This makes it possible to arrange the plurality of detection units 10 as shown in FIG. 7B. In step S63, the control unit 9 drives each detection unit 10 along one axis direction (for example, the X direction) which is different from that in step S62 such that each detection unit 10 is arranged at a position in the X direction in the target position determined in step S61. At this time, the control unit 9 drives the plurality of detection units 10 in consideration of the shape of each detection unit (the shape of each mirror 11b, in particular) so as to reduce the interference of the detection units 10. The control unit 9 drives, for example, the second detection unit 10b and the fourth detection unit 10d in the −X direction, and drives the first detection unit 10a and the third detection unit 10c in the +X direction. By steps S62 and S63, it is possible to arrange, as shown in FIG. 7C, the plurality of detection units 10 in the target positions determined in step S61. In step S64, the control unit 9 controls the respective detection units 10 to detect the marks 7 on the substrate.

As described above, the imprint apparatus 100 according to the first embodiment includes the plurality of detection units 10 (the first detection unit 10a, the second detection unit 10b, the third detection unit 10c, and the fourth detection unit 10d) each having the scope 11a and the mirror 11b. The first detection unit 10a and the second detection unit 10b are arranged so that the directions of the optical axis between their mirrors 11b and scopes 11a are parallel to each other. The third detection unit 10c and the fourth detection unit 10d are arranged so that the directions of the optical axis between their mirrors 11b and scopes 11a are parallel to each other. The third detection unit 10c (fourth detection unit 10d) is arranged so that the direction of the optical axis between the scope 11a and the mirror 11b is perpendicular to the direction of the optical axis between the scope 11a and the mirror 11b in the first detection unit 10a (second detection unit 10b). By forming the plurality of detection units 10 in this way, it is possible to reduce the interference of the detection units 10 even when detecting the marks 7 arranged on the substrate with the narrow spacing.

In each detection unit 10 according to the first embodiment, the scope 11a is formed to emit light in the surface direction parallel to the surface of the substrate 5. However, the scope 11a is not limited to this, but may be arranged to emit light in a direction which is different from the surface direction. In this case as well, each detection unit 10 (the angle of the mirror 11b) may be formed such that the optical axis of light after being emitted from the scope 11a and reflected by the mirror 11b is perpendicular to the surface of the substrate 5. Also, the imprint apparatus 100 according to the first embodiment may evacuate the plurality of detection units 10 so as not to disturb light from the light source 8 when irradiating the imprint material on the substrate with light from the light source 8. Furthermore, the imprint apparatus 100 according to the first embodiment is formed to include four detection units 10. However, the imprint apparatus 100 is not limited to this, but may be formed to include, for example, three detection units 10, or five or more detection units 10. When the imprint apparatus includes, for example, three detection units 10, the direction of the optical axis between the mirror 11b and the scope 11a in one detection unit 10 may be different from that in another detection unit 10.

Second Embodiment

Figure 8:
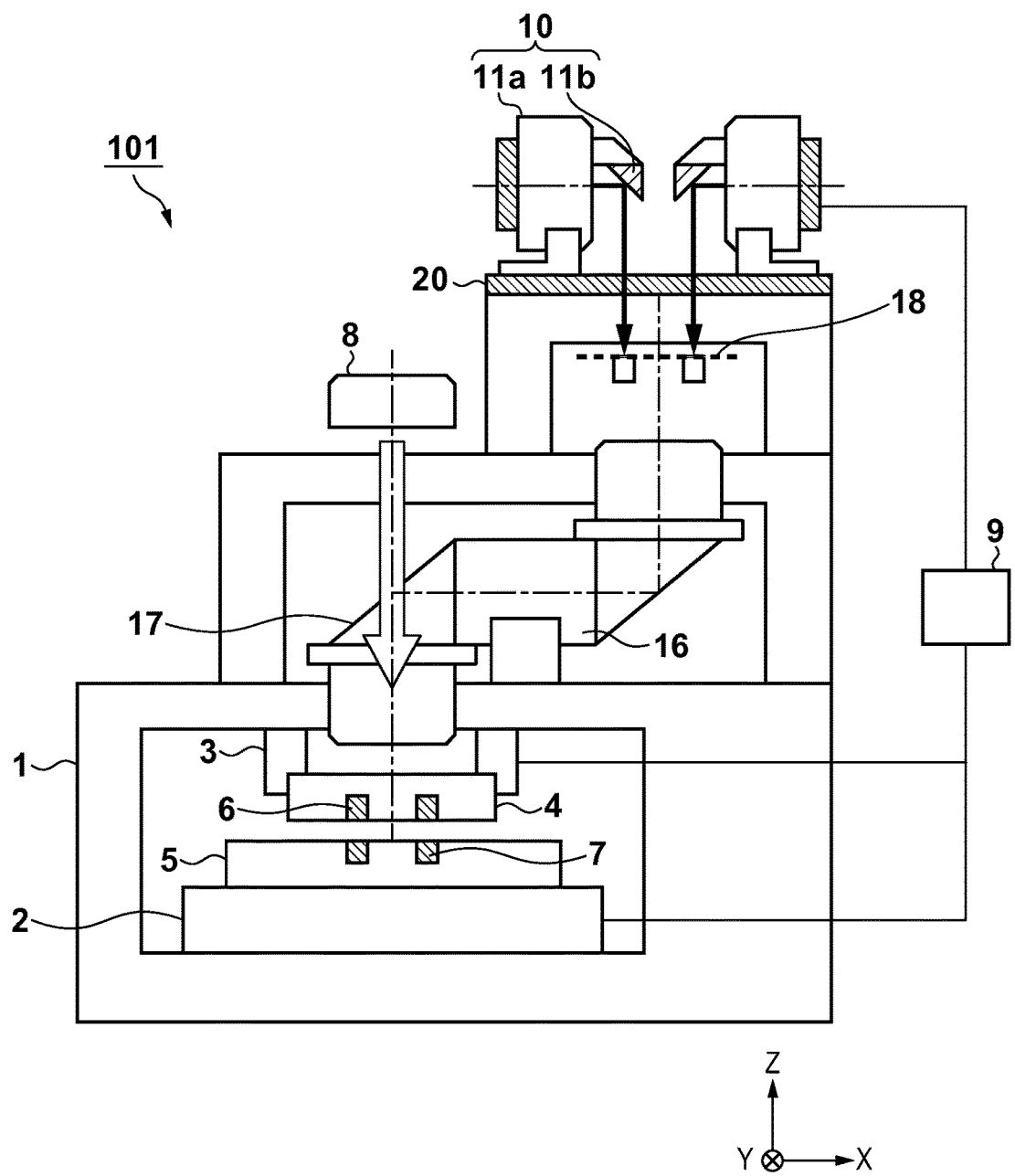
FIG. 8 is a schematic view showing an imprint apparatus according to the second embodiment.

FIG. 8 is a schematic view showing an imprint apparatus 101 according to the second embodiment. The imprint apparatus 101 according to the second embodiment can include an imprint head 3 which holds a mold 4, a substrate stage 2 which holds a substrate 5, and a light source 8 which emits light for curing the imprint material supplied onto the substrate. The imprint apparatus 101 can also include a detection apparatus which detects a plurality of marks provided on the substrate 5 and a control unit 9. The detection apparatus includes, as in the first embodiment, a plurality of detection units 10 which detect marks 6 provided on the mold 4 and marks 7 provided in shot regions on the substrate 5.

The imprint apparatus 101 according to this embodiment includes a relay optical system 16 which is capable of creating a conjugate plane 18 conjugate to a surface where the marks 6 on the mold and the marks 7 on the substrate are formed immediately above the imprint head 3. An optical element such as a lens is formed in the relay optical system 16. The relay optical system 16 can form the marks 6 on the mold 4 and the marks 7 on the substrate 5 into images in the upper portion of the imprint head 3 (can create an imaging plane).

Each detection unit 10 detects the marks 6 and the marks 7 which are formed into the images by the relay optical system 16 and formed on the conjugate plane 18, thereby detecting the relative positions of the mold 4 and the substrate 5. The plurality of detection units 10 can be driven independently by a driving system (the driving unit 20) on a plane in a driving range such that each of them can detect an alignment mark arranged at any position in the driving range.

The relay optical system 16 includes a beam splitter 17 for splitting an optical path into an optical path through which light from the light source 8 passes and an optical path through which light from the marks detected by the detection units 10 passes. For this reason, when irradiating the imprint material on the substrate with light from the light source 8, the detection units 10 do not disturb light from the light source 8. Accordingly, the plurality of detection units 10 may not be retreated.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing an article according to this embodiment includes a step of forming a pattern on a resin applied onto a substrate (a step of performing an imprint process on the substrate) by using the above-described imprint apparatus, and a step of processing the substrate on which the pattern has been formed in the above step. This manufacturing method further includes other well-known steps (for example, oxidation, film formation, deposition, doping, planarization, etching, resist removal, dicing, bonding, and packaging). As compared to the conventional methods, the method of manufacturing the article according to this embodiment is advantageous in at least one of the performance, the quality, the productivity, and the production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2013-244329 filed Nov. 26, 2013, and 2014-215659 filed Oct. 22, 2014, which are hereby incorporated by reference herein in their entirety.

What is claimed is:

1. A detection apparatus for detecting a plurality of marks formed on a shot region of a substrate to which a pattern of a mold is to be transferred, the apparatus comprising:
a plurality of detection units, each of the plurality of detection units including a mirror and a scope configured to detect light from a mark via the mirror,
wherein the substrate includes, as the shot region, a deficient shot region which is arranged in a peripheral portion of the substrate and to which a portion of the pattern of the mold is to be transferred, the deficient shot region including a chip region in which marks are arranged with a spacing narrower than a width of the scope,
wherein the plurality of detection units include a first detection unit, a second detection unit, and a third detection unit which are configured to be able to respectively detect light from the marks arranged in the chip region by bringing the mirrors close to each other, and
wherein in a surface direction parallel to a surface on which the plurality of marks are arranged, a direction of an optical axis between the mirror and the scope in the first detection unit, a direction of an optical axis between the mirror and the scope in the second detection unit and a direction of an optical axis between the mirror and the scope in the third detection unit are different from each other.

2. The apparatus according to claim 1, wherein each of the plurality of detection units is formed such that a width of the mirror is narrower than that of the scope, in a direction parallel to the surface direction and perpendicular to a direction in which light is emitted from the scope.

3. The apparatus according to claim 1, wherein each of the plurality of detection units is configured such that an optical axis of light after being emitted from the scope and reflected by the mirror is perpendicular to a surface on which the plurality of marks are arranged.

4. The apparatus according to claim 1, further comprising a driver configured to individually drive each of the plurality of detection units at least in the surface direction.

5. An imprint apparatus for forming an imprint material on a substrate using a mold on which a pattern has been formed, the apparatus comprising:
a detection apparatus defined in claim 1 including a plurality of detection units and configured to detect a plurality of marks provided on the substrate,
wherein each of the plurality of detection units in the detection apparatus detects a mark provided on the substrate via a corresponding mark provided on the mold when performing alignment between the mold and the substrate.

6. The apparatus according to claim 1, wherein in the surface direction, the direction of the optical axis in the second detection unit is opposite to the direction of the optical axis in the first detection unit.

7. The apparatus according to claim 1, wherein the directions of the optical axes of the first, the second and the third detection units are set such that the first, the second and the third detection units are able to simultaneously detect light from the marks arranged in the chip region.

8. The apparatus according to claim 1, wherein the surface, on which the plurality of marks are arranged, includes a plane conjugate to a surface where marks on the mold or marks on the substrate is formed.

9. The apparatus according to claim 1, wherein
in each of the plurality of detection units, the mirror is supported by the scope through a support member, and
in a case of detecting the marks arranged in the chip region, the mirror of one of the first, second and third detection units is arranged in a rectangular space adjacent to the support member and the scope of another of the first, second and third detection units, in the surface direction.

10. The apparatus according to claim 1, wherein
the substrate includes, as the shot region, a full shot region to which the entire pattern of the mold is to be transferred, and
the first, second and third detection units are configured to be able to respectively detect marks arranged in corners of the full shot region.

11. The apparatus according to claim 1, wherein in the surface direction, the direction of the optical axis in the third detection unit is perpendicular to at least one of the direction of the optical axis in the first detection unit and the direction of the optical axis in the second detection unit.

12. The apparatus according to claim 11, wherein in the surface direction, the direction of the optical axis in the second detection unit is parallel to the direction of the optical axis in the first detection unit.

13. The apparatus according to claim 12, wherein the scope of the first detection unit and the scope of the second detection unit emit light in the surface direction, and
a direction in which the scope of the second detection unit emits light is an opposite direction to a direction in which the scope of the first detection unit emits light.

14. The apparatus according to claim 12, wherein the plurality of detection units include a fourth detection unit, and a direction of an optical axis between the mirror and the scope in the fourth detection unit is parallel to the direction of the optical axis in the third detection unit.

15. The apparatus according to claim 14, wherein the scope of the third detection unit and the scope of the fourth detection unit each emits light in the surface direction, and
a direction in which the scope of the fourth detection unit emits light is an opposite direction to a direction in which the scope of the third detection unit emits light.

16. The apparatus according to claim 14, wherein in a case of detecting the marks arranged in the chip region, the mirror in each of the first, second, third and fourth detection units is arranged within a region whose widths of a first direction and a second direction perpendicular to each other on a surface parallel to a surface on which the plurality of marks are arranged are narrower than a width of the scope.

17. The apparatus according to claim 14, wherein in a case where the plurality of detection units detect four marks arranged in positions at vertexes of a square, the first detection unit and the second detection unit detect two marks, out of the four marks, arranged in a diagonal direction, and the third detection unit and the fourth detection unit detect two marks which are different from the two marks detected by the first detection unit and the second detection unit.

18. A method of manufacturing an article, the method comprising:
forming a pattern to an imprint material on a substrate using an imprint apparatus; and
processing the substrate, on which the pattern has been formed, to manufacture the article,
wherein the imprint apparatus, which forms the imprint material on the substrate using a mold on which a pattern has been formed, includes:
a detection apparatus configured to detect a plurality of marks formed on a shot region of the substrate to which the pattern of the mold is to be transferred,
wherein the detection apparatus includes:
a plurality of detection units, each of the plurality of detection units including a mirror and a scope configured to detect light from a mark via the mirror,
wherein the substrate includes, as the shot region, a deficient shot region which is arranged in a peripheral portion of the substrate, and to which a portion of the pattern of the mold is to be transferred, the deficient shot region including a chip region in which marks are arranged with a spacing narrower than a width of the scope,
wherein the plurality of detection units include a first detection unit, a second detection unit, and a third detection unit which are configured to be able to respectively detect light from the marks arranged in the chip region by bringing the mirrors close to each other, and
wherein in a surface direction parallel to a surface on which the plurality of marks are arranged, a direction of an optical axis between the mirror and the scope in the first detection unit, a direction of an optical axis between the mirror and the scope in the second detection unit and a direction of an optical axis between the mirror and the scope in the third detection unit are different from each other.

* * * * *